United States Patent [19]

Kobayashi et al.

[11] 4,211,971
[45] Jul. 8, 1980

[54] RATIO METER FOR CAPACITIVE-TYPE DISPLACEMENT CONVERTER

[75] Inventors: Tamotsu Kobayashi; Sadaki Igarashi, both of Yokohama, Japan

[73] Assignee: Hokushin Electric Works, Ltd., Tokyo, Japan

[21] Appl. No.: 920,180

[22] Filed: Jun. 29, 1978

[30] Foreign Application Priority Data

Jun. 30, 1977 [JP] Japan .......................... 52/87463[U]

[51] Int. Cl.² .......................... G01R 7/04; G06G 7/16
[52] U.S. Cl. .............................. 324/140 D; 324/61 R; 328/161
[58] Field of Search ............. 324/74, 130, 131, 140 D, 324/61 R; 364/850; 328/161

[56] References Cited

U.S. PATENT DOCUMENTS

| | | | |
|---|---|---|---|
| 3,711,774 | 1/1973 | Bohler | 324/74 X |
| 3,771,056 | 11/1973 | Zimmerman | 324/130 X |
| 3,778,710 | 12/1973 | Snook | 324/131 X |
| 3,795,918 | 3/1974 | Sunderland | 324/140 D X |
| 3,952,248 | 4/1976 | Hannigsberg | 324/140 D |
| 4,037,154 | 7/1977 | Chamran et al. | 324/74 X |
| 4,082,998 | 4/1978 | Marriott | 324/130 X |

*Primary Examiner*—Gerard R. Strecker
*Attorney, Agent, or Firm*—Michael Ebert

[57] ABSTRACT

A ratio meter adapted to determine the ratio of a first input signal representing the difference between two input voltages and a second signal representing the sum of both input voltages.

3 Claims, 7 Drawing Figures

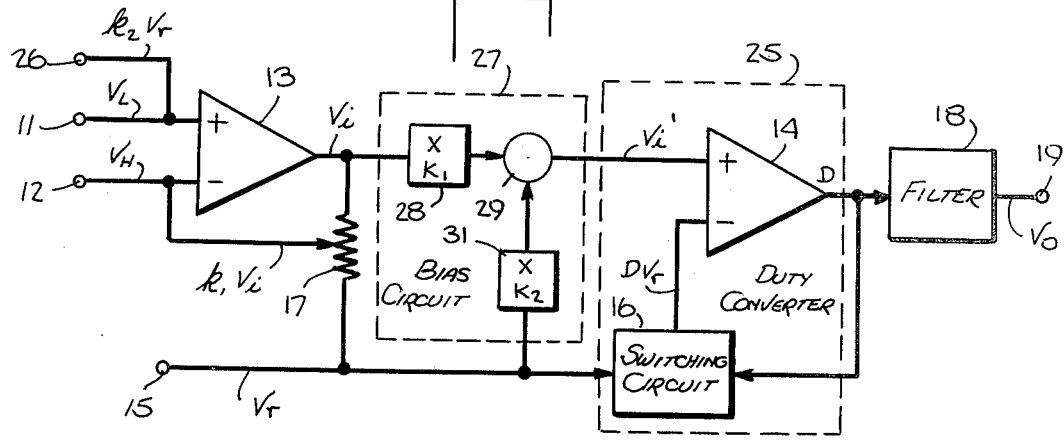
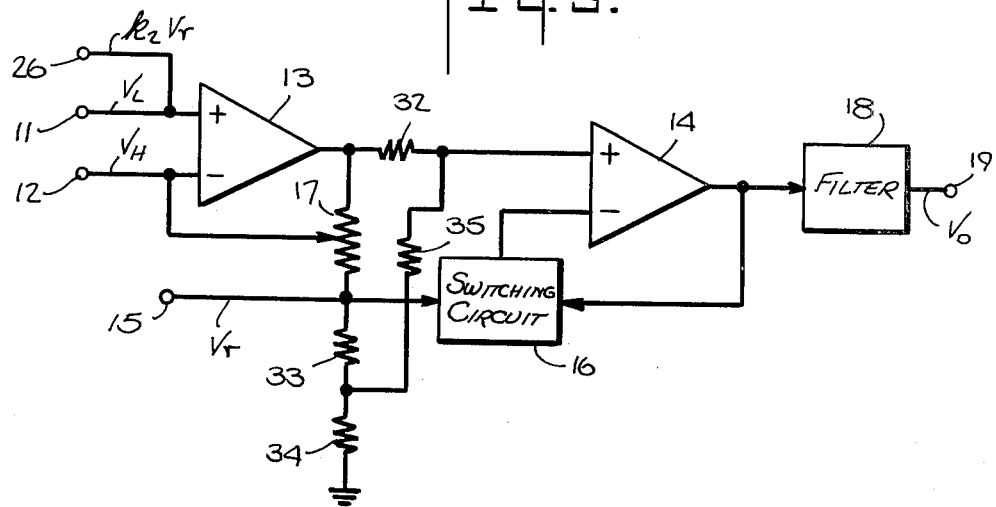
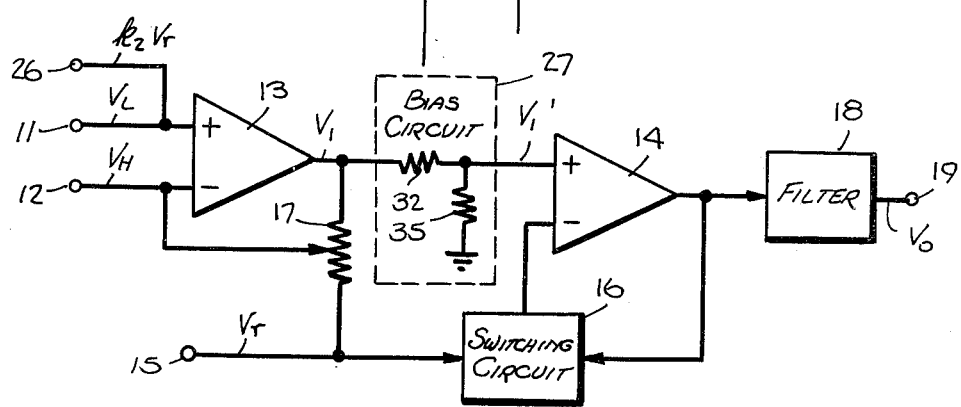

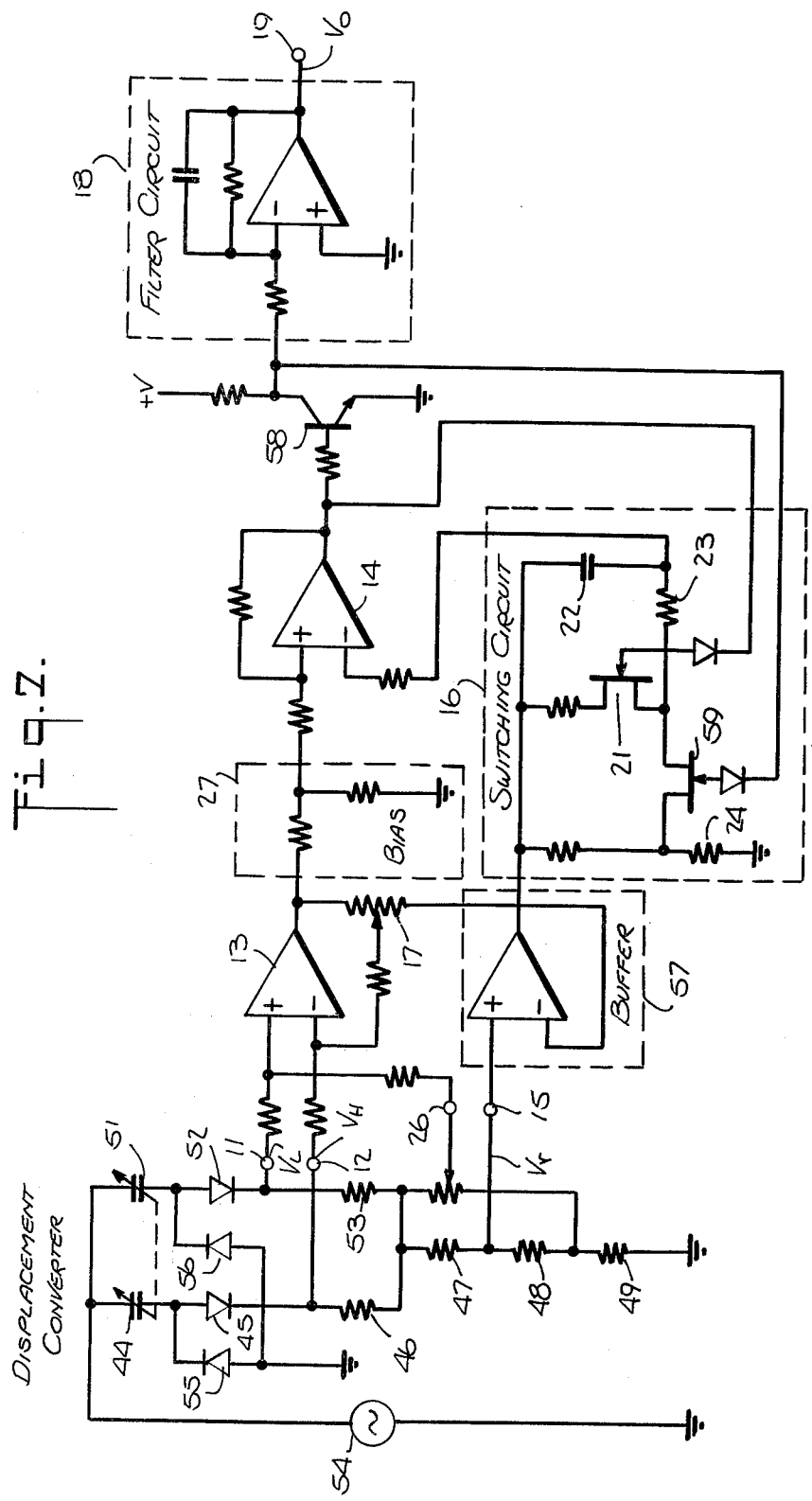

4,211,971

RATIO METER FOR CAPACITIVE-TYPE DISPLACEMENT CONVERTER

BACKGROUND OF THE INVENTION

This invention relates to a ratio meter which produces an output proportional to the ratio between first and second inputs.

In Japanese patent application 154321/75, entitled "Capacitative Type Displacement Converter," there is disclosed an arrangement in which a pair of capacitors are caused to vary differentially in response to a displacement. High frequency signals are applied to these capacitors to derive therefrom currents proportional thereto. These currents are detected to obtain the ratio of the difference between the currents and the sum of both currents. Such ratio detection serves to eliminate the undesirable influence of amplitude and frequency fluctuations in the high-frequency signals as well as variations in the capacitance of the capacitors as a result of temperature changes. While a ratio meter in accordance with the invention will be described as it operates in conjunction with a displacement converter of the capacitative type, it is to be understood that the meter is usable in other applications.

SUMMARY OF INVENTION

The main object of this invention is to provide an improved ratio meter to determine the ratio between a first input signal representing the difference between two voltages or current variables, such as those derived from a capacitativetype displacement converter, and a second input signal representing the sum of the variables.

More particularly, it is an object of this invention to provide a ratio meter in which a bias voltage is added to the output of a span adjustment circuit for span setting by multiplying one of the inputs by a variable coefficient to ensure that even where an input varies in the negative direction in the vicinity of the zero point, if it is smaller than a certain value, then a duty pulse will be produced to maintain the proportional relationship of the duty-ratio between the input difference voltage and the zero difference voltage, thereby making possible zero point adjustment.

OUTLINE OF DRAWINGS

For a better understanding of the invention as well as other objects and further features thereof, reference is made to the following detailed description to be read in conjunction with the accompanying drawings, wherein:

FIG. 4 is a block diagram explanatory of the principles underlying a ratio meter according to the invention;

FIGS. 5 and 6 are block diagrams illustrating specific operative examples of a bias circuit employed in the ratio meter in accordance with the invention; and FIG. 7 is a circuit diagram showing a specific operative example of the ratio meter as applied to a capacitancetype displacement converter.

DETAILED DESCRIPTION OF INVENTION

Prior Art

Figure 1:
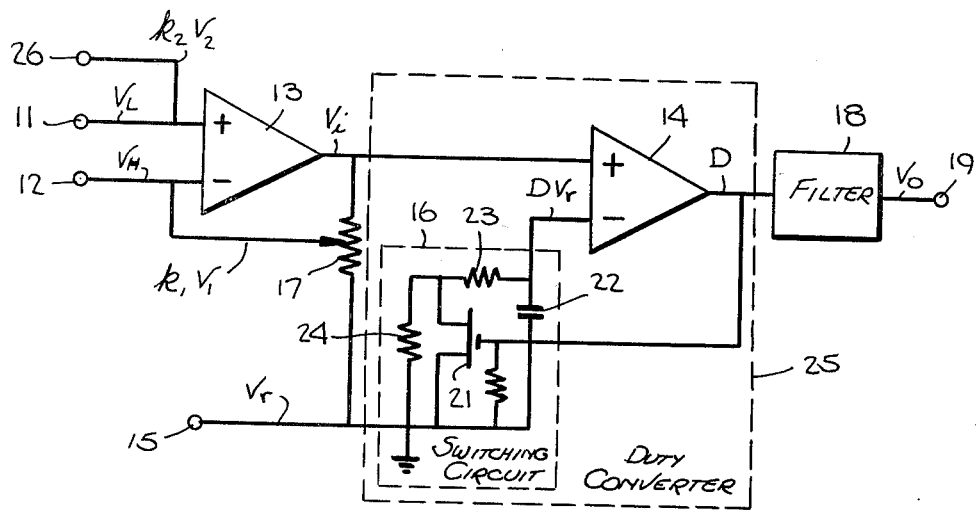
FIG. 1 is a block diagram illustrating a prior art ratio meter.

Before describing a ratio meter in accordance with the invention, we shall first disclose in connection with FIG. 1 the manner in which ratio detection is carried out in a prior art arrangement.

Supplied to a terminal 11 is a voltage $V_L$ proportional to the capacitance of one of the capacitors in the previously-described displacement converter whose capacitance decreases in response to a displacement. Supplied to a terminal 12 is a voltage $L_H$ proportional to the capacitance of the other capacitor whose capacitance undergoes a corresponding increase in response to the same displacement. The respective voltages applied to terminals 11 and 12 are fed to the non-inverted (+) and the inverted (−) inputs of a differential amplifier 13.

The output voltage $V_i$ representing the difference value yielded by differential amplifier 13 is applied to the non-inverted input (+) of a comparator 14. At the same time, a signal $V_r$ representing the sum of currents proportional to the degree the respective capacitances have decreased and increased in accordance with the displacement, is supplied via a terminal 15 to a switching circuit 16. Connected between terminal 15 and the output of differential amplifier 13 is a potentiometer 17 whose adjustable slider is connected to the inverted input (−) of differential amplifier 13, whereby the output $V_i$ of this amplifier is fed back as a feedback voltage $k_1 V_i$. By adjusting potentiometer 17, span adjustment is effected.

Sum signal $V_r$ and the output of comparator 14 are applied to switching circuit 16, whereby the sum signal $V_r$ is switchingly-controlled by the comparator output to produce a signal proportional to the output of sum signal $V_r$ and the duty ratio D of the output pulse from comparator 14. The output $DV_r$ from switching circuit 16 is applied to the inverted input (−) of comparator 14. The output from comparator 14 is smoothed by a filter circuit 18 to derive at an output terminal 19 an output signal $V_o$ proportional to $V_i/V_r$.

For example, in the event the output from comparator 14 has dropped to its low level, the FET 21 in the switching circuit 16 is rendered nonconducting and voltage $V_r$ from terminal 15 then charges capacitor 22 across resistors 23 and 24, causing voltage $V_c$ at the inverted input of comparator 14 to drop. When voltage $V_c$ has dropped to a value corresponding to the hysteresis width of comparator 14 with respect to the input voltage $V_i$ to the non-inverted input, comparator 14 is inverted to provide a high-level output to cause FET 21 to conduct, thereby allowing the charge stored in capacitor 22 to be discharged through resistor 23 and FET 21.

When voltage $V_c$ at the inverting input of comparator 14 has in this manner dropped more than a predetermined extent with respect to input voltage $V_i$, comparator 14 is inverted again, and the above-noted operations are repeated. As a consequence, comparator 14 yields at its output a pulse having a duty ratio D proportional to the ratio between the two input voltages $V_i$ and $V_r$. In other words, comparator 14 and switching circuit 16 together constitute a duty converter 25 producing a pulse whose duty ratio is proportional to the ratio between input voltage $V_i$ and $V_r$.

With such an arrangement, when FET 21 is rendered conductive, voltage $V_c$ at the inverted input of comparator 14 approaches input voltage $V_r$ from terminal 15, and when voltage $V_c$ attains a level exceeding input voltage $V_i$ at the non-inverted input by more than a predetermined value, comparator 14 is then inverted. But when input voltage $V_i$ is higher than voltage $V_r$, input voltage $V_c$ cannot become higher than voltage $V_r$; hence it cannot exceed voltage $V_i$ and comparator 14 cannot be inverted, as a consequence of which its output remains at a high level to hold FET 21 in its ON state.

Figure 2:
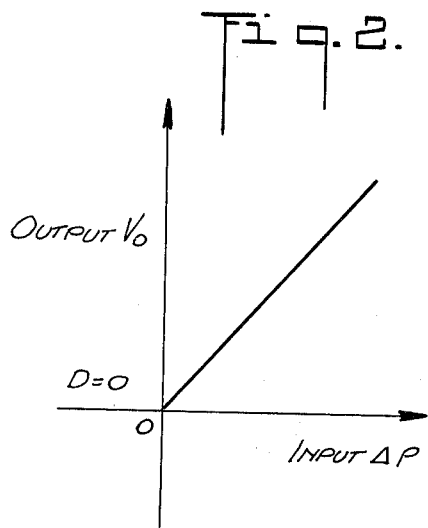
FIG. 2 is a graph showing the input-output characteristic of the prior art meter.

That is to say, in the displacement converter of the above-described prior arrangement, as shown in FIG. 2, the point at which the capacitance difference component voltage $V_i=0$ is the point of zero displacement. If a displacement D occurs in a manner causing voltage $V_i$ to increase from the zero displacement point in the positive direction, the output linearly changes with the displacement D. However, if displacement D occurs in the reverse direction, the output remains zero. Accordingly, should this situation arise, there is the possibility that zero displacement—that is, a shift in the zero point of the input—will not produce any output.

To avoid this drawback, one may apply a bias voltage so that a finite output is produced when displacement D is zero. This is accomplished in the arrangement shown in FIG. 1 where a voltage $k_2V_r$ proportional to the sum voltage valve $V_r$ is applied at terminal 26 to the non-inverted input of differential amplifier 13 to derive therefrom an output in the case of zero displacement. But in this arrangement, span adjustment by potentiometer 17 results in a shift of the zero point, giving rise to undesirable interference between the zero point adjustment and the span adjustment.

In a difference voltage converter, checking the zero point when the difference voltage is zero is a very effective way to maintain accuracy, this check being widely practiced in the art. However, in the circuit shown in FIG. 1, the generating point of the output pulse from the duty converter 25 is coincident with the point of zero difference voltage, as described above, so that where displacement D changes in the reverse direction and the difference voltage $\Delta P$ is negative, output $V_o$ becomes constant and the presence of the zero point cannot be detected, making zero point adjustment difficult.

THE PRESENT INVENTION

To overcome the above-described defects in the prior art arrangement, the present invention provides a ratio meter in which a certain bias voltage is added to the output from a span adjustment circuit for span setting by multiplying one of the inputs by a variable coefficient to ensure that even where an input varies in the negative direction in the vicinity of the zero point, if it is smaller than a certain value, then a duty pulse will be produced to maintain the proportional relationship of the duty ratio between the input difference voltage and the output pulse in the neighborhood of the zero difference voltage, making possible easy zero point adjustment.

In accordance with the present invention, as shown in FIG. 4, wherein components corresponding to those in FIG. 1 are identified by like reference numerals, a bias circuit 27 is interposed between the output of differential amplifier 13 and the input of comparator 14. In bias circuit 27, output voltage $V_i$ from differential amplifier 13 is multiplied by constant $K_1$ in a multiplier 28 and is supplied to an adder 29. At the same time, input voltage $V_r$ from terminal 15 is multiplied by constant $K_2$ in a multiplier 31 and supplied to adder 29. The output $V_i'$ from adder 29 which is equal to $K_1V_i+K_2V_R$ is applied to the non-inverted input of comparator 14. The voltages $V_1$, and $V_r$ are processed by duty converter 25 as follows:

$$D = \frac{K_1V_i + K_2V_r}{2} = K_1\frac{V_i}{V_2} + K_2;$$

where $K_1$ and $K_2$ are proportional constants.

Figure 3:
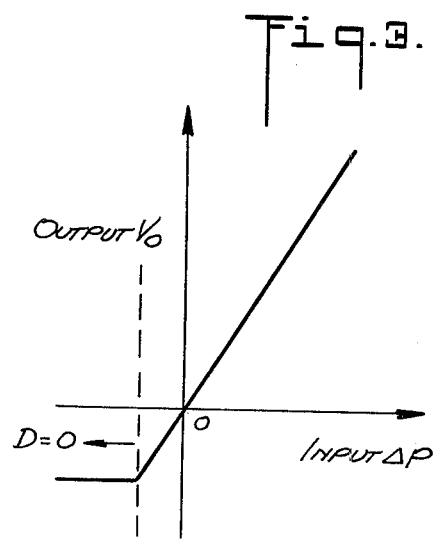
FIG. 3 is a graph showing a preferred input-output characteristic in accordance with the invention.

Consequently, a desired pulse having a duty ratio proportional to $V_i/V_r$ is obtained, and merely the constant $K_2$ is added. Then by adjusting $K_2V_r$ so that $V_i=V_r$ in the case of zero displacement, and by selecting $K_1$ and $K_2$ to be positive even where $V_i$ is negative, if $K_1$ and $K_2$ are suitably selected, D becomes positive to produce the input-output characteristic shown in FIG. 3.

FIG. 5 illustrates a specific operative example of the bias circuit 27 included in FIG. 4. The output of differential amplifier 13 is connected via a resistor 32 to the non-inverted (+) input of comparator 14, while terminal 15 is connected via resistors 33 and 34 to a common potential point, and the junction of resistors 33 and 34 is connected via a resistor 35 to the non-inverted (+) input of comparator 14. In this case, the constant $K_1$ is 1 and the constant $K_2$ is the voltage-dividing ratio of resistors 33 and 34.

Resistor 35 may also be connected to the common potential point, as depicted in FIG. 6. In this instance, if the potential at terminal 15 is used as the reference, the end of resistor 35 on the side of the common potential point is given a voltage $-V_r$, so that voltage $-V_r$ and the other input voltage $V_i$ are added together by bias circuit 27. Letting the resistance values of resistors 32 and 35 be represented by $r_a$, $r_b$, respectively, if follows that:

$$K_1 = \frac{r_b}{r_a + r_b} \text{ and } K_2 = \frac{-r_a}{r_a + r_b}$$

As is readily evident from FIG. 6, the difference input voltage $V_i$ and the sum input voltage $V_r$ from terminal 15 are set by the zero point adjustment in such a manner that they are made equal to each other at the zero point by bias voltage $k_2V_r$ from terminal 26. The sum input voltage $V_r$ is applied, as it is, to switching circuit 16, but the difference input voltage $V_i$ is voltage-divided by resistors 32 and 35 into $V_i'$ and is thereafter supplied to comparator 14.

Accordingly, in the conventional circuit described previously with regard to FIG. 1, when input voltage $V_i$ has become larger than voltage $V_r$, the output from comparator 14 is not inverted, whereas in the FIG. 6 circuit, even if voltage $V_i$ has exceeded voltage $V_r$ to some extent, since voltage $V_i$ is voltage-divided by bias circuit 27 into lower voltage $V_i'$, voltage $V_r$ is higher than voltage $V_i'$ at the input of comparator 14, so that comparator 14 is inverted to perform an ON-OFF operation of its output, thereby carrying out a duty-converting operation.

Displacement Converter

In FIG. 7, there is illustrated a specific operative example of the invention as applied to a capacitance-type displacement converter. One end of a capacitor 44 is connected to a common potential point via a diode 45 and serially-connected resistors 46, 47, 48 and 49. One end of a capacitor 51 whose capacitance is differentially-changed by displacement with respect to that of capacitor 44, is connected to the junction of resistors 46 and 47 via a diode 52 and a resistor 53.

The other ends of capacitors 44 and 51 are connected together to an AC signal source 54. The junction of capacitor 44 and diode 45 and the junction of capacitor 51 and diode 52 are connected to the common potential point via diodes 55 and 56, respectively. The AC signal from AC signal source 54 is half-wave rectified by diodes 45 and 52.

Assuming that values $C_1$ and $C_2$ represent the capacitances of capacitors 44 and 51, respectively, that value E represents the amplitude of the AC signal and that value W represents the angular frequency, then a signal proportional to $WC_1E$ is obtained across resistor 46 while a signal proportional to $WC_2E$ is obtained across resistor 53. These signals are supplied to differential amplifier 13 via the terminals 11 and 12, respectively.

Currents proportional to $C_1E$ and $C_2E$, respectively flow across resistors 48 and 49 in common to these currents, a voltage $V_r$ proportional to the sum of these currents being derived at the junction of resistors 47 and 48. Voltage $V_r$ is supplied from terminal 15 to switching circuit 16 through a buffer circuit 57. The other components corresponding to those in the foregoing description are marked with like reference numerals.

For bias circuit 27, use is made of the embodiment thereof shown in FIG. 6. The output of comparator 14 is supplied to the gate of FET 21 in switching circuit 16 and is at the same time subjected to waveform shaping by a switching transistor 58. The collector output of transistor 58 is fed to filter circuit 18 and the gate of a FET 59 in the switching circuit.

In accordance with the invention set forth above, the ratio between output voltage $V_i$ from differential amplifier 13 and voltage $V_r$ at terminal 15 is determined by adjustement of the bias value from terminal 26 so that they are equal in level to each other at the zero point. In this state, even if the span is adjusted by adjusting potentiometer 17, output voltage $V_i$ does not undergo any change, so that no interference occurs between the zero adjustment and the span adjustment. Moreover, an output proportional to the input in the vicinity of the zero point is provided by bias circuit 27.

While there has been shown and described a preferred embodiment of a ratio meter in accordance with the invention, it will be appreciated that many changes and modifications may be made therein without, however, departing from the essential spirit thereof.

We claim:

1. A ratio meter to determine the ratio of a first input signal representing the difference between two variables and a second input signal representing the sum of these variables, said meter comprising:

A a span adjustment circuit responsive to the difference between the two variables to produce said first input signal;

B a bias circuit having an adder to one input of which is applied the product of the first input signal and a first constant and to another input of which is applied the product of the second input signal and a second constant to produce a biased output which is the sum of these products;

C a duty converter constituted by a comparator having a non-inverting input and an inverting input, and a switching circuit controlled by the duty pulse output of said comparator, the biased output of the bias circuit being applied to said non-inverting input, the second input signal being applied to said inverting input through said switching circuit in accordance with the duty pulse output of said comparator; and D a filter coupled to the output of said comparator to smooth the duty pulses to yield the desired output.

2. A ratio meter as set forth in claim 1, wherein said span adjustment circuit is constituted by a differential amplifier having an inverting and non-inverting input to which the respective two variables are applied, the output of said amplifier being fed back through a potentiometer to the inverting input.

3. A ratio meter as set forth in claim 1 in combination with a displacement converter constituted by two capacitors which are caused to vary differentially in response to a displacement, means being included to derive said variables from said capacitors.

* * * * *